US012772783B2

(12) United States Patent
Shin

(10) Patent No.: US 12,772,783 B2
(45) Date of Patent: Oct. 20, 2026

(54) LOAD PORT MODULE AND DRIVING METHOD THEREOF

(71) Applicant: Samsung Electronics Co., Ltd., Suwon-si (KR)

(72) Inventor: Sang Lyong Shin, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 575 days.

(21) Appl. No.: 18/354,191

(22) Filed: Jul. 18, 2023

(65) Prior Publication Data

US 2024/0128104 A1 Apr. 18, 2024

(30) Foreign Application Priority Data

Oct. 18, 2022 (KR) ........................ 10-2022-0133713
Jan. 19, 2023 (KR) ........................ 10-2023-0008062

(51) Int. Cl.
*H10P 72/00* (2026.01)
*B25J 9/16* (2006.01)
(Continued)

(52) U.S. Cl.
CPC ...... *H10P 72/0608* (2026.01); *H10P 72/0616* (2026.01); *H10P 72/3302* (2026.01);
(Continued)

(58) Field of Classification Search
CPC ......... H01L 21/67265; H01L 21/67288; H01L 21/681; H10P 72/0608; H10P 72/0616;
(Continued)

(56) References Cited

U.S. PATENT DOCUMENTS 6,014,965 A * 1/2000 Nishida ................ G01R 31/308 451/6
6,175,418 B1 * 1/2001 Madeyski ............. G03F 7/7075 356/399

(Continued)

FOREIGN PATENT DOCUMENTS

JP 2009239102 A 10/2009
JP 2021128995 A 9/2021

(Continued)

OTHER PUBLICATIONS

KR-101843473-B1 (Year: 2018).*

*Primary Examiner* — Ernesto A Suarez
*Assistant Examiner* — Laurence R Brothers
(74) *Attorney, Agent, or Firm* — Wolf, Greenfield & Sacks, P.C.

(57) ABSTRACT

A load port module includes: a mounting table configured to receive a container, wherein the container is configured to receive a substrate therein; a door opener is configured to open and close a door of the container; an image generator is on the door opener, and the image generator is configured to generate a first image of the substrate at a first angle with respect to the substrate, and a second image of the substrate at a second angle with respect to the substrate different from the first angle; and a controller is configured to determine warpage of the substrate based on the first image and to determine alignment of the substrate based on the second image.

19 Claims, 16 Drawing Sheets

(51) Int. Cl.
*B25J 11/00* (2006.01)
*H10P 72/30* (2026.01)
*H10P 72/50* (2026.01)

(52) U.S. Cl.
CPC ............. *H10P 72/53* (2026.01); *B25J 9/1653* (2013.01); *B25J 9/1674* (2013.01); *B25J 11/0095* (2013.01)

(58) Field of Classification Search
CPC ..... H10P 72/3302; H10P 72/53; B25J 9/1653; B25J 9/1674; B25J 11/0095
See application file for complete search history.

(56) References Cited

U.S. PATENT DOCUMENTS

| | | | | |
|---|---|---|---|---|
| 9,239,228 | B2 | 1/2016 | Natsume et al. | |
| 2001/0020199 | A1* | 9/2001 | Bacchi | B25J 9/042 700/247 |
| 2005/0035313 | A1* | 2/2005 | Garssen | H01L 21/67265 250/559.33 |
| 2018/0323095 | A1* | 11/2018 | Peh | H01L 21/67265 |
| 2021/0334949 | A1 | 10/2021 | Abe et al. | |

FOREIGN PATENT DOCUMENTS

| | | | | |
|---|---|---|---|---|
| KR | 20080084310 | A | 9/2008 | |
| KR | 20100047389 | A | 5/2010 | |
| KR | 101843476 | B1 | 3/2018 | |
| KR | 101843473 | B1 * | 5/2018 | H01L 22/12 |
| KR | 20180130209 | A | 12/2018 | |

* cited by examiner

LOAD PORT MODULE AND DRIVING METHOD THEREOF

CROSS-REFERENCE TO RELATED APPLICATION

This application claims priority from Korean Patent Application No. 10-2022-0133713 filed on Oct. 18, 2022, and No. 10-2023-0008062 filed on Jan. 19, 2023, in the Korean Intellectual Property Office, and all the benefits accruing therefrom under 35 U.S.C. 119, the contents of which in its entirety are herein incorporated by reference.

BACKGROUND

1. Technical Field

The present disclosure relates to a load port module and a driving method thereof.

2. Description of the Related Art

The substrate is transported and stored through a storage container. Taking out the substrate from the storage container for processing, transferring, etc. of the substrate is performed by a load port module connected to a processing facility. The load port module opens a cover of the storage container, contacts the cover, and separates the cover from a main body of the storage container.

SUMMARY

A substrate may be in each of a plurality of slots of the storage container. In order to handle the substrates in the container, information on whether the substrate is located in each slot (i.e., mapping information), information on whether the substrate is distorted in each slot (i.e., alignment information), and information on whether the substrate of each slot is bent (i.e., warpage information) may be desirable. In order to acquire such information, various instruments were required and a lot of time was consumed.

Aspects of the present disclosure may provide a load port module that may be capable of quickly and accurately acquiring mapping information, alignment information, and warpage information.

Aspects of the present disclosure may also provide a driving method of a load port module that may be capable of quickly and accurately acquiring mapping information, alignment information, and warpage information.

Aspects of the present disclosure are not limited to the aspects mentioned above, and other aspects not mentioned will be clearly understood by those skilled in the art from the following description.

According to some exemplary embodiments of the present disclosure, there is provided a load port module including: a mounting table configured to receive a container, wherein the container is configured to hold a substrate; a door opener configured to open and close a door of the container; an image generator on the door opener, wherein the image generator is configured to generate a first image of the substrate at a first angle with respect to an extension direction relative to a slot of the container, and a second image of the substrate at a second angle with respect to the extension direction that is different from the first angle; and a controller configured to determine warpage of the substrate based on the first image and checking alignment of the substrate based on the second image.

According to some exemplary embodiments of the present disclosure, there is provided a load port module including: a mounting table configured to receive a wherein the container is configured to hold a substrate therein; a door opener configured to open and close a door of the container and to ascend or descend between a first position and a second position; an image generator on the door opener and configured to generate a plurality of images of the substrate; and a controller configured to determine a state of the substrate based on the plurality of images, wherein the image generator includes: a body configured to ascend and descend along one surface of the door opener, a head connected to the body and configured to adjust an angle formed with a slot of the container, and a camera unit on the head and configured so that an angle of imaging the substrate is changed according to the angle adjustment of the head, wherein the camera unit is configured to generate a first image of the substrate in a direction parallel to the slot of the container, and the controller is configured to determine a warpage of the substrate based on the first image, and wherein the camera unit is configured to generate a second image of the substrate in a direction obliquely looking or facing downwards towards the slot of the container, and the controller is configured to determine an alignment of the substrate based on the second image and to map a position of the substrate in the container.

According to some exemplary embodiments of the present disclosure, there is provided a driving method of a load port module. The load port module includes a mounting table configured to receive a container, the container being configured to hold a plurality of substrates therein; a door opener configured to open and close a door of the container, and an image generator on the door opener. The method includes opening, with the door opener, a door of the container; generating, with the image generator, a first image of each of the plurality of substrates in the container at a first angle with respect to each corresponding one of the plurality of substrates, as the door opener descends; moving the door opener to ascend upward; generating, with the image generator, a second image of each of the plurality of substrates in the container at a second angle different from the first angle with respect to each corresponding one of the plurality of substrates, as the door opener descends; and determining, with a controller, a warpage of each of the plurality of substrates based on a corresponding first image and an alignment of the each of the plurality of substrates based on a corresponding second image.

The details of other exemplary embodiments are included in the detailed description and drawings.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE EMBODIMENTS

Figure 1:
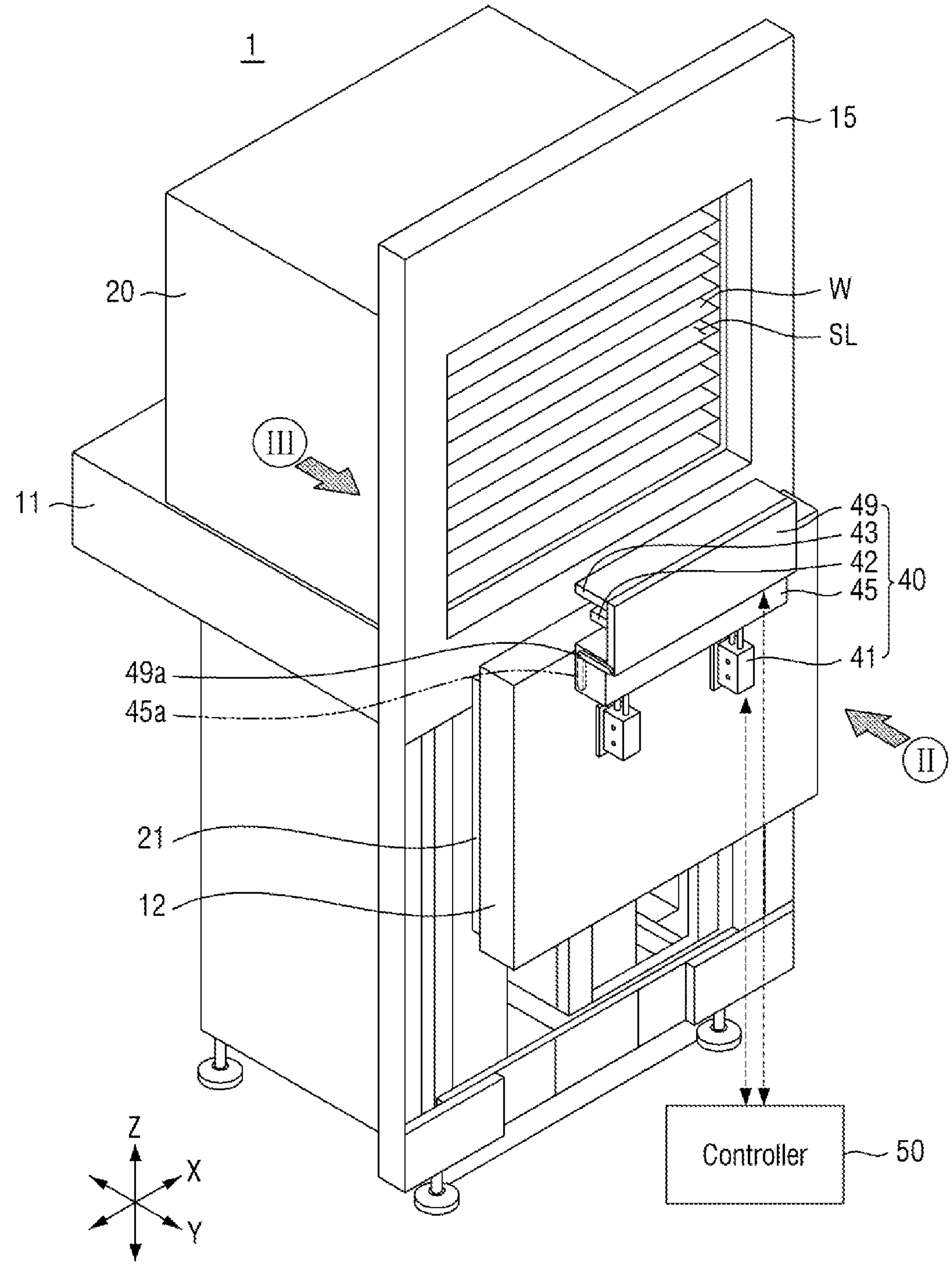
FIG. 1 is a perspective view for describing a load port module according to some exemplary embodiments of the present disclosure.

Hereinafter, exemplary embodiments of the present disclosure will be described in detail with reference to the accompanying drawings. In describing the exemplary embodiments of the present disclosure with reference to the accompanying drawings, components that are the same as or correspond to each other will be denoted by the same reference numerals, and an overlapping description thereof will be omitted.

Figure 2A:
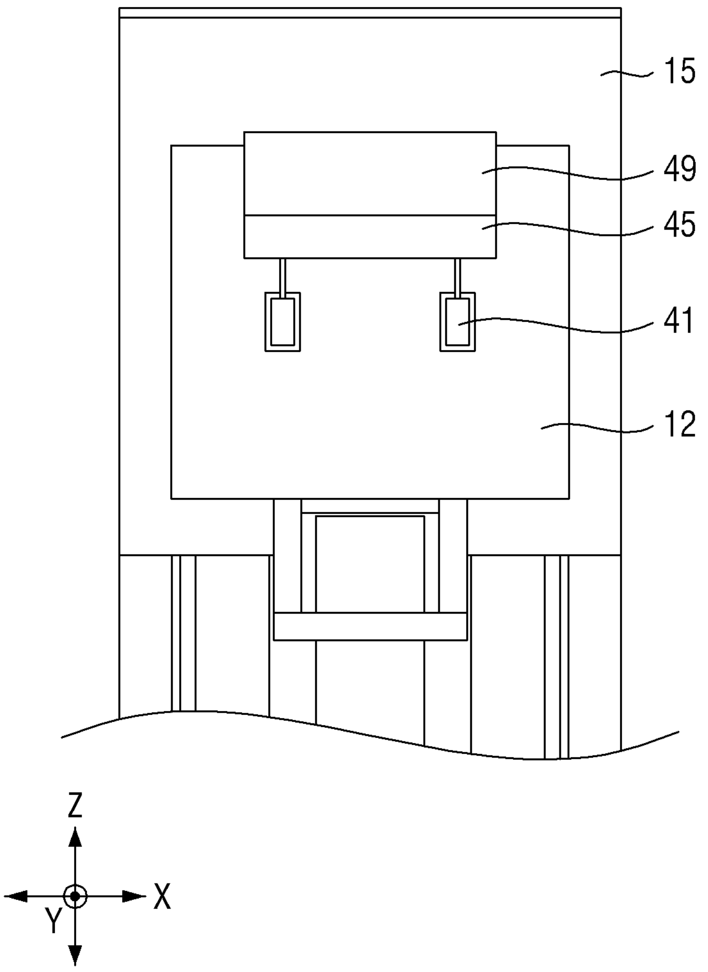
FIGS. 2A and 2B are views for describing an operation of a cover opener of FIG. 1.
Figure 2B:
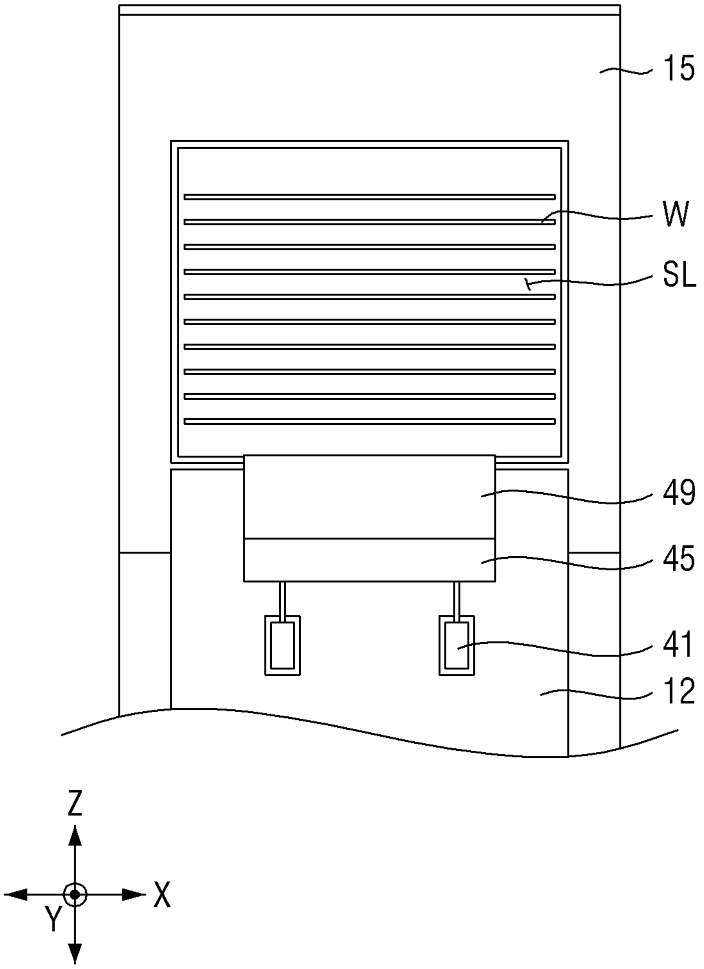
Figure 3:
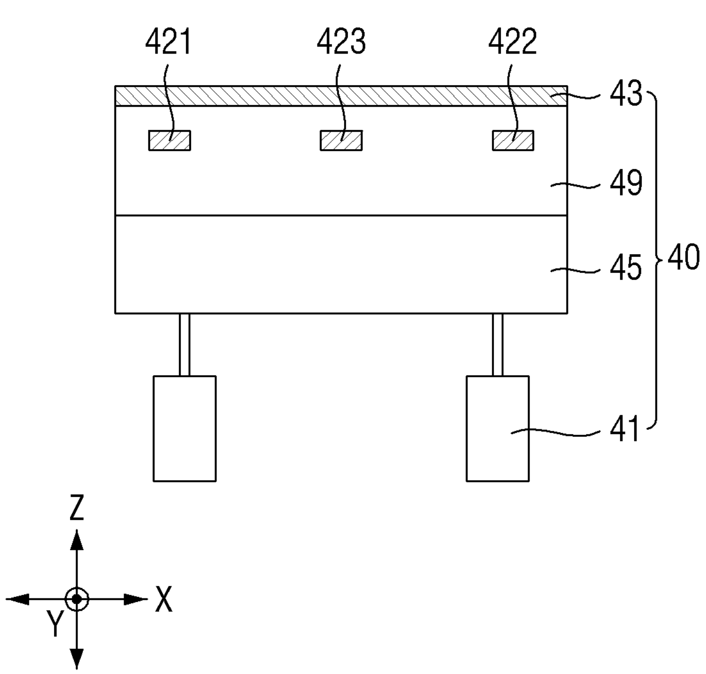
FIG. 3 is a view for describing an image generator of FIG. 1.

FIG. 1 is a perspective view for describing a load port module according to some exemplary embodiments of the present disclosure. FIGS. 2A and 2B are views for describing an operation of a cover opener of FIG. 1. FIG. 3 is a view for describing an image generator of FIG. 1. FIGS. 2A and 2B are views of the cover opener and the image generator viewed from a direction II of FIG. 1, and FIG. 3 is a view of the image generator viewed from a direction III of FIG. 1.

First, referring to FIG. 1, a load port module 1 according to some exemplary embodiments of the present disclosure includes a mounting table 11, a frame 15, a door opener 12, an image generator 40, and a controller 50.

The mounting table 11 is in the X-Y plane, and is configured to mount a container 20 accommodating a substrate W (e.g., a wafer, a panel, etc.) thereon. The mounting table 11 is configured to receive the container 20, and the container 20 is configured to hold a substrate W. The container 20 may be, for example, a Front-Opening Unified Pod (FOUP) or a Front Open Shipping Box (FOSB), but is not limited thereto. The container 20 includes a plurality of slots SL that are configured to receive a plurality of substrates W. The plurality of slots SL may a plurality of plates configured to support the substrates W. The plurality of plates may be spaced apart at regular intervals, and the substrate W may be seated in a space between adjacent plates (i.e., the slot SL). The substrate W may be supported by the plate.

The frame 15 is connected to the mounting table 11 and parallel to a third direction Z. An opening is provided in the frame 15.

The door opener 12 is on the frame 15 and is configured to close or open a door 21 of the container 20 placed on the mounting table 11. The door opener 12 is configured to pass through the opening of the frame 15. In addition, the door opener 12 is configured to be able to ascend and descend.

For example, as illustrated in FIG. 2A, the door opener 12 approaches the container 20 from the front and opens the door 21. For example, since a latch key (not illustrated) is in the door opener 12, the latch key may be inserted into the door 21 of the container 20 to open the door 21. Then, as illustrated in FIG. 2B, when the door opener 12 contacts and holds the door 21 and descends, the slot SL of the container 20 and/or the substrate W are exposed as a result.

Referring back to FIG. 1, the image generator 40 is on the door opener 12. The image generator 40 generates a plurality of images by photographing or imaging the substrate W in the container 20 at a plurality of angles. For example, the image generator 40 generates a first image by imaging the substrate W in the container 20 at a first angle, and generates a second image by imaging the substrate W in the container 20 at a second angle different from the first angle. For example, imaging the substrate W at the first angle includes imaging the substrate W in a direction parallel to the slot SL of the container 20. Imaging the substrate W at the second angle includes imaging the substrate W in a direction obliquely looking or facing downward towards the slot SL of the container 20.

Since the image generator 40 is on the door opener 12, the image generator 40 moves together with the door opener 12 according to an operation of the door opener 12. As the door opener 12 descends, the image generator 40 images the substrate W in the container 20. For example, the descent of the door opener 12 and the imaging by the image generator 40 may also be performed simultaneously, and after the door opener 12 descends and stops for a period of time, the imaging of the image generator 40 is performed, and then the door opener 12 descends again.

The image generator 40 includes a body 45, a head 49, and a camera unit 42.

The body 45 is configured to ascend and descend along one side of the door opener 12. For example, the body 45 is configured to ascend/descend by a cylinder 41 on the door opener 12.

The head 49 is connected to the body 45 and is configured such that an angle formed with the slot SL (and/or the substrate W) in the container 20 is adjusted. For example, the body 45 and the head 49 may be connected through a connecting portion 49*a*. The head 49 may move between a first position parallel to an extension direction of the body 45 (e.g., the third direction Z) and a second position forming an acute angle with the extension direction of the body 45.

In addition, a guide groove 45*a* is on a sidewall of the body 45, and as the connecting portion 49*a* ascends/descends along the guide groove 45*a*, the head 49 ascends/descends.

The camera unit 42 is on the head 49. Since the camera unit 42 is on the head 49, a viewing angle of the substrate W and/or the slot SL is changed according to an angle adjustment of the head 49.

As illustrated in FIG. 3, the camera unit 42 may include a plurality of cameras (or vision cameras) 421, 422, and 423.

The plurality of cameras 421, 422, and 423 are spaced apart from each other along the first direction X, for example. Each of the plurality of cameras 421, 422, and 423 may image different areas of the substrate W. The plurality of cameras 421, 422, and 423 may include, for example, a camera 421 on a left side, a camera 422 on a right side, and a camera 423 at a center. Unlike illustrated, the camera unit 42 may include two cameras or four or more cameras. In addition, unlike illustrated, the plurality of cameras 421, 422, and 423 may form two or more rows instead of one row.

Additionally, the image generator 40 further includes a light unit 43 on the head 49. The light unit 43 may be above the plurality of cameras 421, 422, and 423, for example.

Referring back to FIG. 1, the controller 50 controls the door opener 12 and the image generator 40. In addition, the controller 50 may receive the first image and the second image from the image generator 40 to check or determine warpage (or bending) or alignment of the substrate W and to additionally map a position of the substrate W in the container 20.

The controller 50 determines warpage of the substrate W based on the first image. The controller 50 may determine alignment of the substrate W or map a position of the substrate W based on the second image.

Hereinafter, operations of the image generator 40 and the controller 50 will be described in detail with reference to FIGS. 4 to 9.

Figure 4:
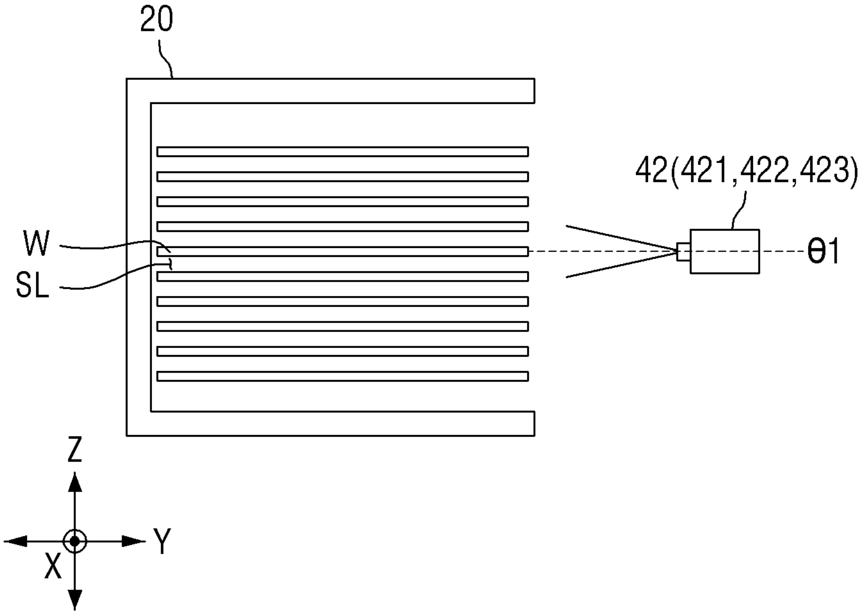
FIGS. 4 and 5 are conceptual views for describing a first operation of acquiring a first image by the image generator of FIG. 1.
Figure 5:
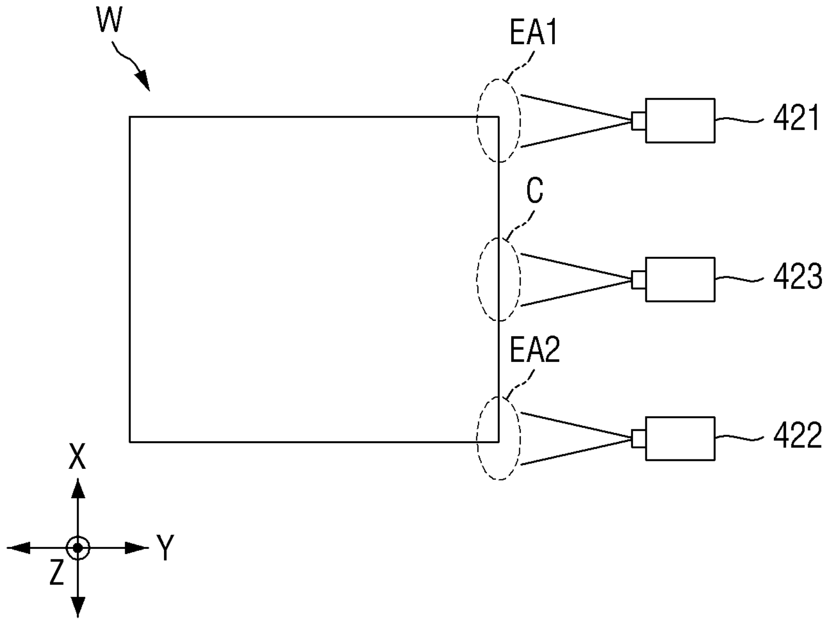
Figure 6:
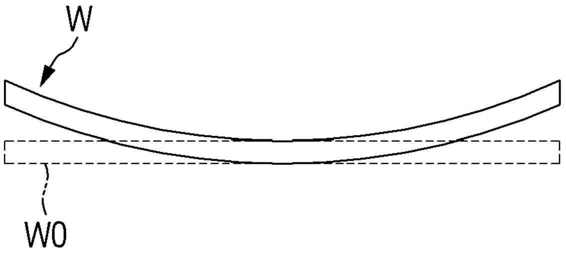
FIG. 6 describes a method of determining warpage using the acquired first image.

FIGS. 4 and 5 are conceptual views for describing a first operation of acquiring a first image by the image generator of FIG. 1. FIG. 6 describes a method of determining warpage using the acquired first image.

Referring to FIG. 4, a plurality of slots SL are in the container 20 along the third direction Z, and the substrate W may be in each of the plurality of slots SL. The substrate W may also not be accommodated in some of the slots SL.

The camera unit 42 images the substrate W at a first angle θ1. The first angle θ1 may be a direction parallel to the slot SL of the container 20. The first angle θ1 may be an angle based on an extension direction (e.g., the second direction Y) of the plate implementing the slot SL, and may be 0° based on the extension direction of the plate as illustrated. Therefore, the camera unit 42 images the front of the substrate W (i.e., the front viewed from the second direction Y).

As illustrated in FIG. 5, the first camera 421 is configured to image a first edge area EA1 of the substrate W, the second camera 422 is configured to image a second edge area EA2 of the substrate W, and the third camera 423 is configured to image a center area C of the substrate W. The center area C may be a space between the first edge area EA1 and the second edge area EA2.

The controller 50 uses the plurality of cameras 421, 422, and 423 to determine the warpage of the substrate W. By imaging the edge areas EA1 and EA2 and the center area C of the substrate W, it is possible to determine whether the substrate is warped. The controller 50 calculates first images imaged by the plurality of cameras 421, 422, and 423 to determine the warpage of the substrate W. For example, as illustrated in FIG. 6, the controller 50 compares a substrate WO on which no warpage occurs and the substrate W corresponding to the first images. Through the comparison, it may be seen that the substrate W has a shape in which the first edge area EA1 and the second edge area EA2 are raised.

The controller 50 determines the warpage of the substrate W, and then determines whether the substrate W may be used in the process. The substrate W on which warpage of a reference value or more has occurred is not subjected to a subsequent process, and the substrate W on which warpage of a reference value or less has occurred is subjected to the subsequent process.

Again in FIG. 4, the camera unit 42 images all the substrates W in the container 20 at the first angle θ1 while moving in the third direction Z. The controller 50 checks or determines the warpage for each of the substrates W in the container 20, and determines whether or not a subsequent process will be performed on the substrate W.

Figure 7:
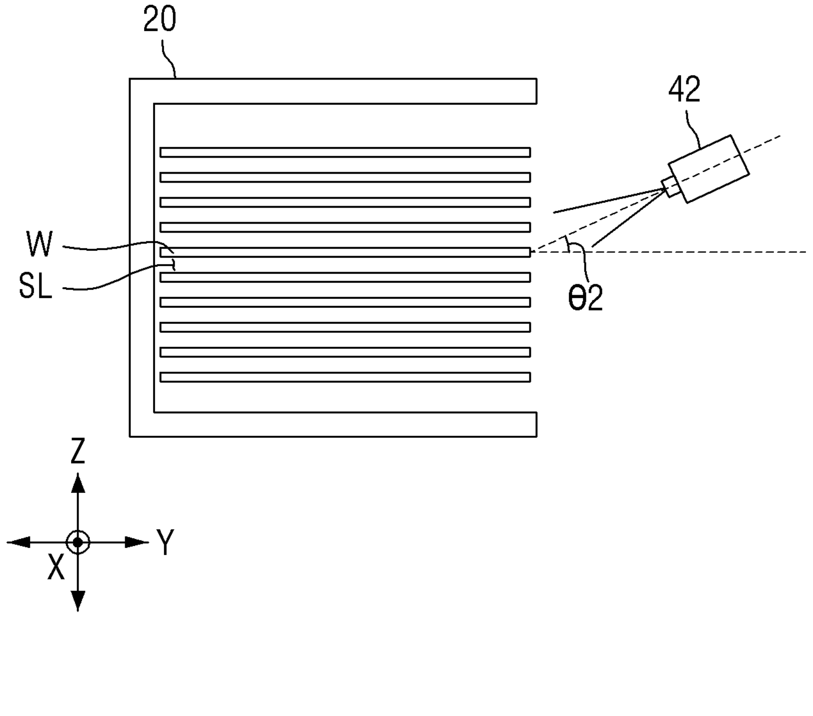
FIG. 7 is a conceptual view for describing a second operation of acquiring a second image by the image generator of FIG. 1.
Figure 8:
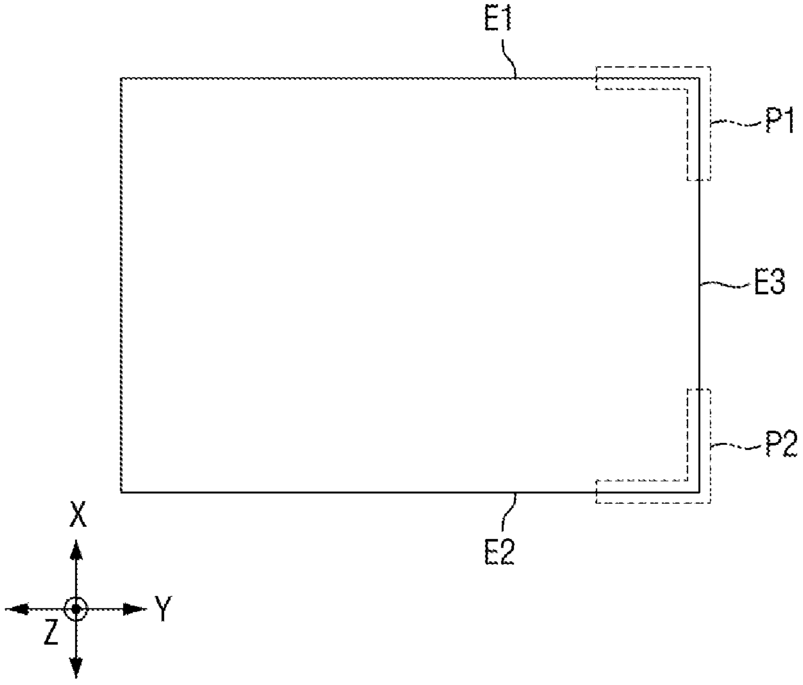
FIG. 8 is a conceptual view for describing a method of determining alignment of a substrate using the acquired second image.
Figure 9:
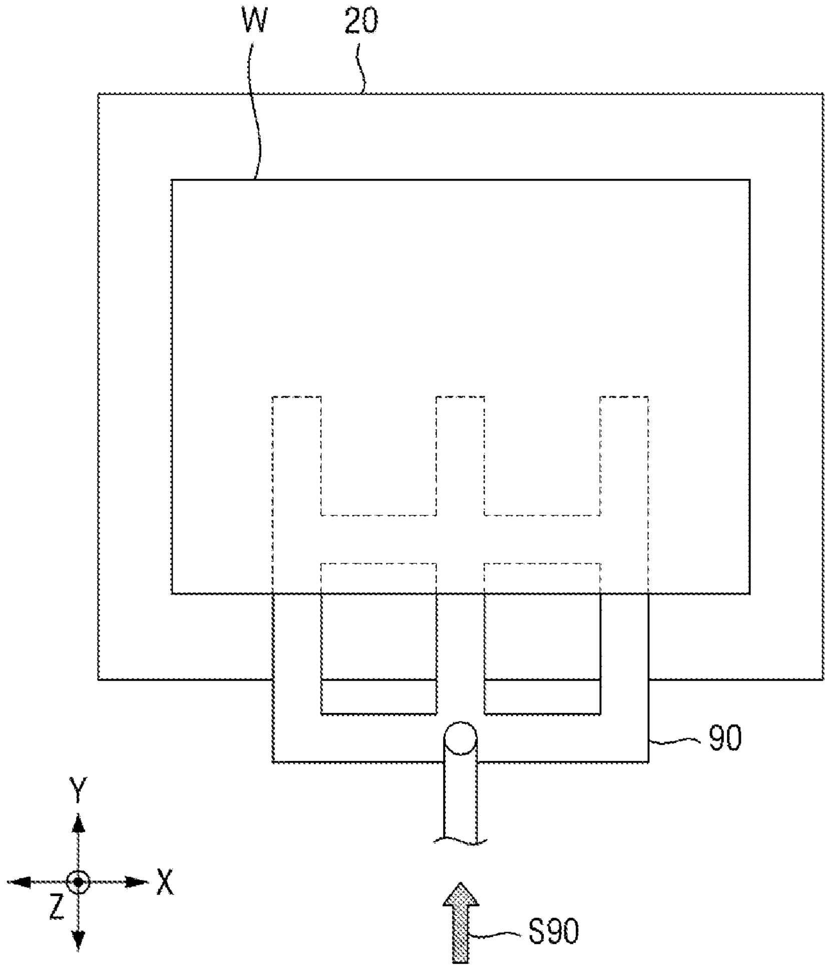
FIGS. 9 and 10 describe a method of controlling a robot hand using the acquired second image.
Figure 10:
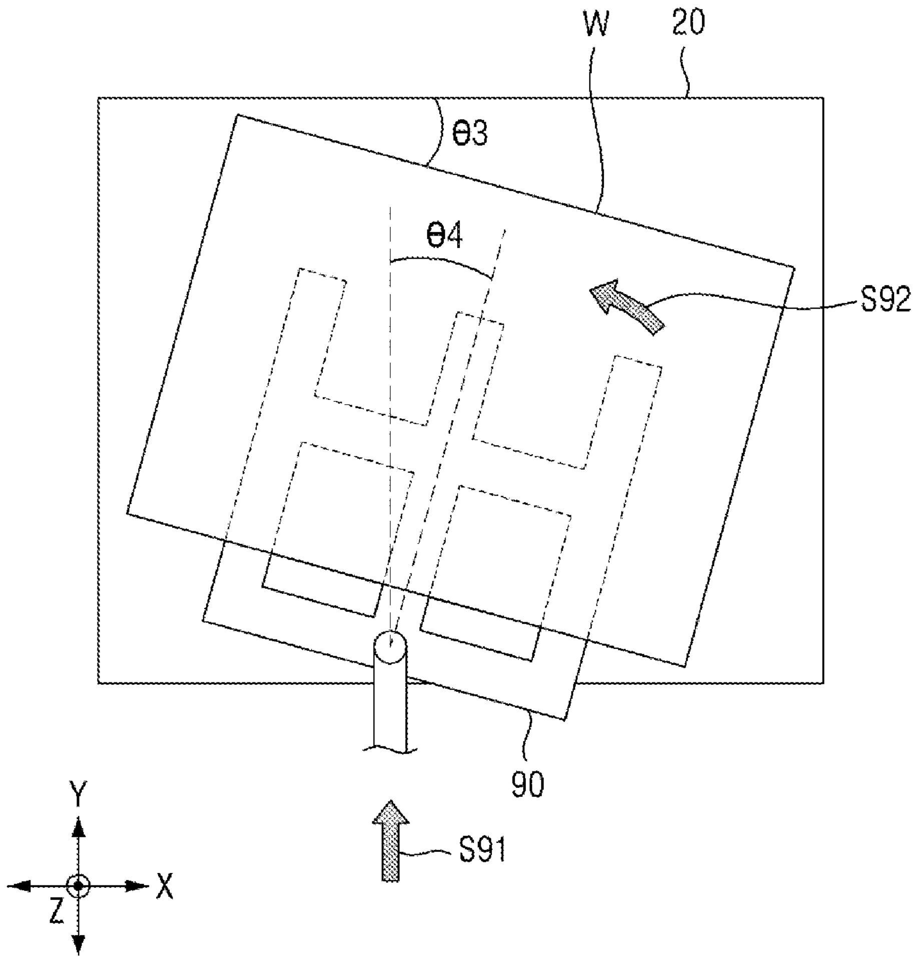

FIG. 7 is a conceptual view for describing a second operation of acquiring a second image by the image generator of FIG. 1. FIG. 8 is a conceptual view for describing a method of determining alignment of a substrate using the acquired second image. FIGS. 9 and 10 describe a method of controlling a robot hand using the acquired second image.

Referring to FIG. 7, the camera unit 42 images the substrate W at a second angle θ2. The second angle θ2 may be a direction of obliquely looking or facing downward towards the slot SL of the container 20. The second angle θ2 may be an angle based on the extension direction (e.g., the second direction Y) of the plate implementing the slot SL, and may be an acute angle based on the extension direction of the plate as illustrated. That is, the camera unit 42 images the substrate W (or plate) in the direction of obliquely looking or facing downwards towards the substrate W.

Referring to FIGS. 7 and 8, since the camera unit 42 images the substrate W while obliquely looking down or facing downwards towards the substrate W, the camera unit 42 images a front surface E3 and edge surfaces E1 and E2 of the substrate W.

Using the images generated in this way, the controller 50 determines the alignment of the substrate W.

Specifically, the controller 50 recognizes a first intersecting portion P1 and a second intersecting portion P2 from the front surface E3 and the edge surfaces E1 and E2 which are imaged. Here, the first intersecting portion P1 is an area where the front surface E3 and the edge surface E1 intersect, and the second intersecting portion P2 is an area where the front surface E3 and the edge surface E2 are connected.

The controller 50 may determine the alignment of the substrate W by comparing the imaged intersecting portions P1 and P2 of the substrate W with the intersecting portions of the substrate W without distortion. That is, the controller 50 determines whether the substrate W is distorted in at least one of an x-direction, a y-direction, and a θ-direction.

The controller 50 controls the robot hand 90 (FIGS. 9 and 10) by reflecting an alignment state of the substrate W.

FIG. 9 illustrates that the substrate W is in a normal state without distortion. In the case of FIG. 9, the robot hand 90 enters the container 20 without being distorted (see reference numeral S90). The robot hand 90 contacts a lower surface of the substrate W, lifts the substrate W from the bottom, and takes the substrate W out of the container 20.

FIG. 10 illustrates that the substrate W is in a distorted state (see reference numeral θ3).

By reflecting the distorted state of the substrate W (see reference numeral θ3), the robot hand 90 enters the container 20 while being distorted (see reference numeral θ4) (see reference numeral S91).

Subsequently, the robot hand 90 contacts (or holds) the lower surface of the substrate W, and lifts the substrate W from the bottom to a predetermined height.

Subsequently, the robot hand 90 rotates the substrate W by a predetermined angle (see reference numeral θ4) so that the substrate W may be in a normal state (see reference numeral S92).

Subsequently, the robot hand 90 takes the substrate W out of the container 20.

By doing so, the robot hand 90 may take out the substrate W without colliding with the inside of the container 20 with the substrate W.

Alternatively, the controller 50 may determine the presence or absence of the substrate W in the corresponding slot SL using the corresponding second image imaged at the second angle θ2 with respect to an extension direction relative to a slot SL of the container 20.

As will be described later, when the image generator 40 images the second images for all slots SL/substrates W of the container 20, the controller 50 may determine the presence or absence of substrates W in all slots SL of the container 20. Accordingly, the controller 50 may perform a mapping operation. For example, assuming that there are 10 slots SL configured to receive the substrates W in the container 20, the controller 50 may perform a mapping operation by determining where the substrate W is positioned within the 10 slots SL and where the substrate W is not positioned within the 10 slots SL, using the second images.

In summary, in some exemplary embodiments of the present disclosure, the image generator 40 capable of imaging the substrate W at the plurality of angles is on the door opener 12. Through images at the plurality of angles, it may be possible to quickly and accurately acquire warpage information, alignment information, and mapping information.

Figure 11:
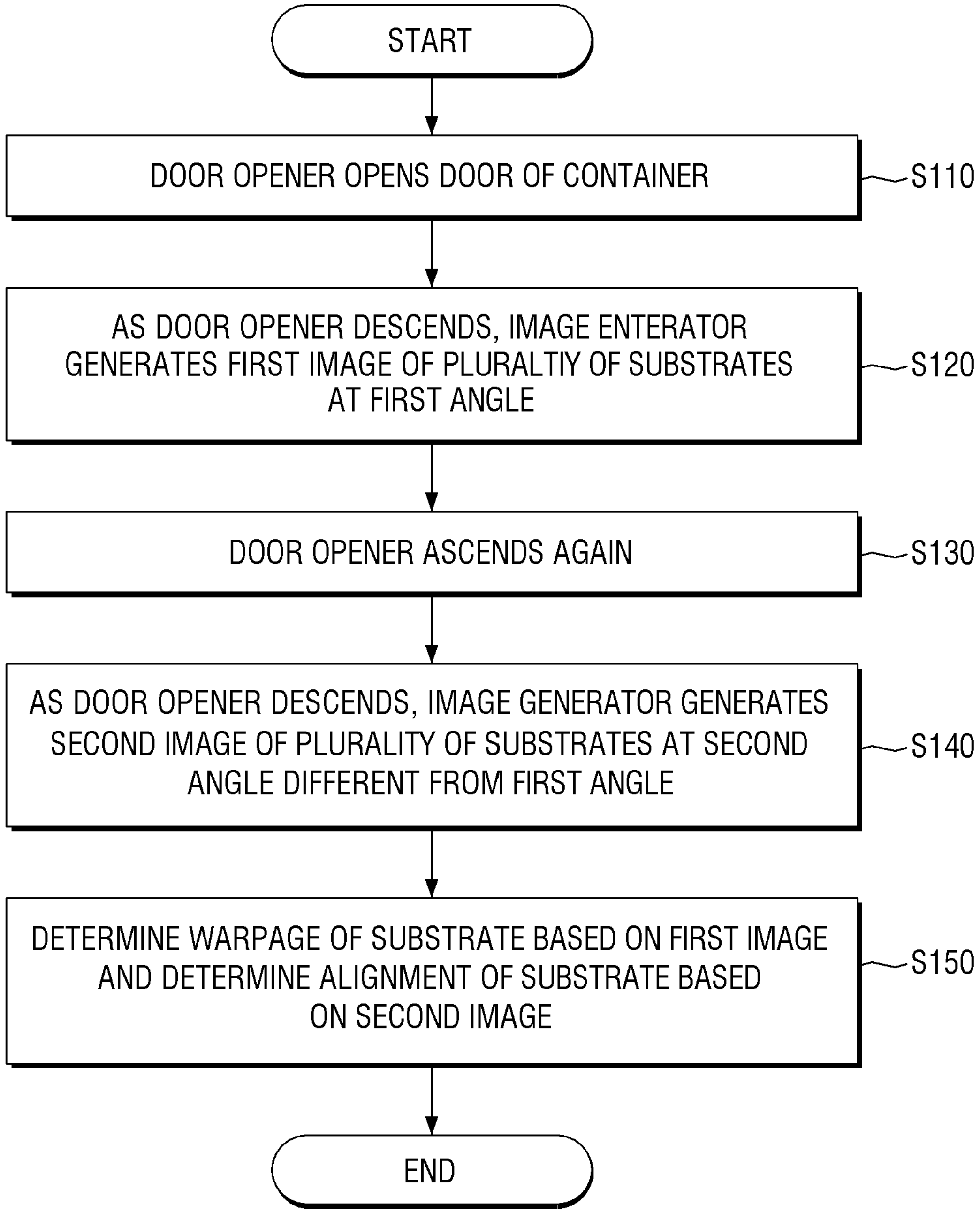
FIG. 11 is a flow chart for describing a driving method of a load port module according to some exemplary embodiments of the present disclosure.
Figure 12:
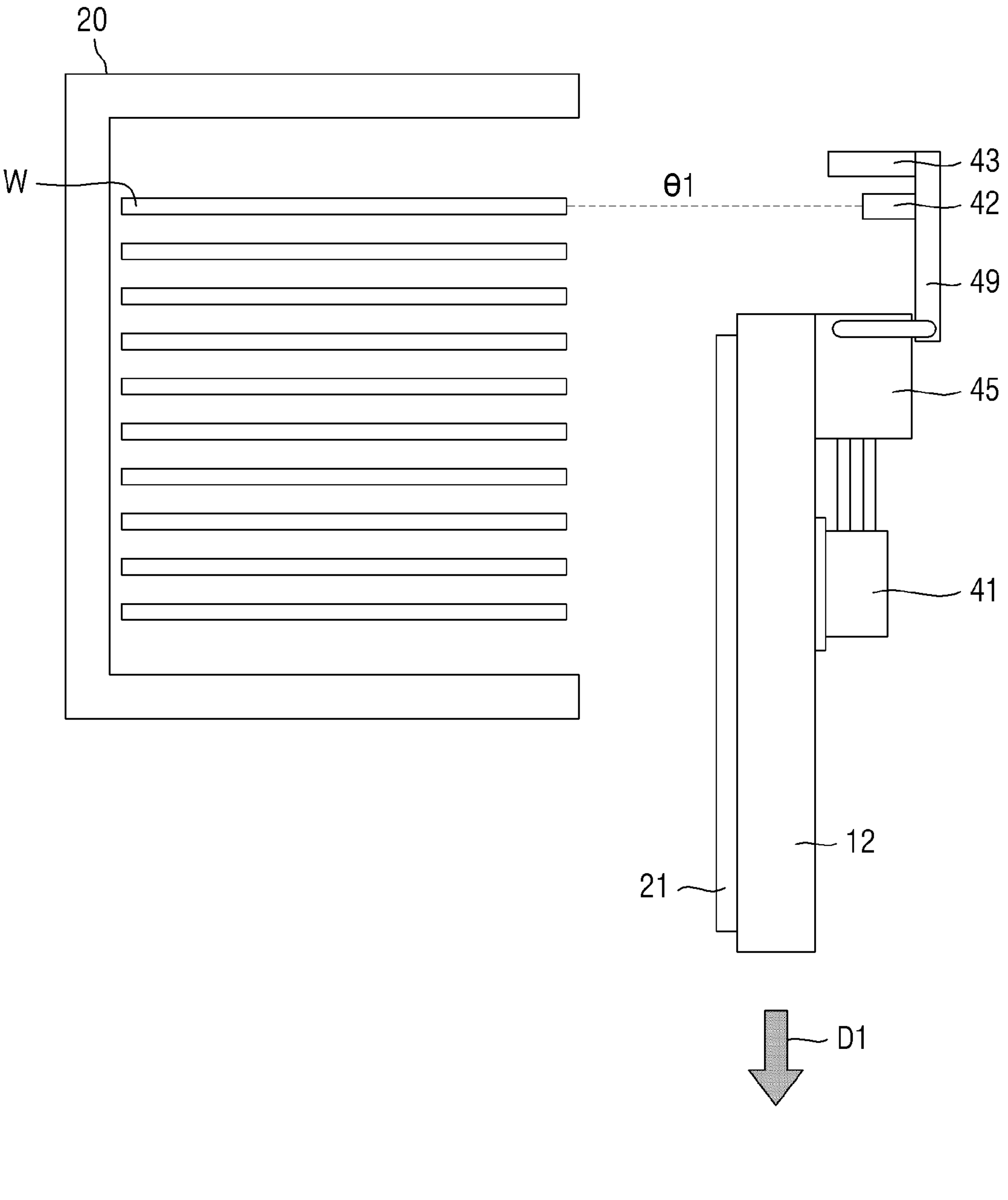
FIG. 12 is an intermediate step view for describing step S120 of FIG. 11.
Figure 13:
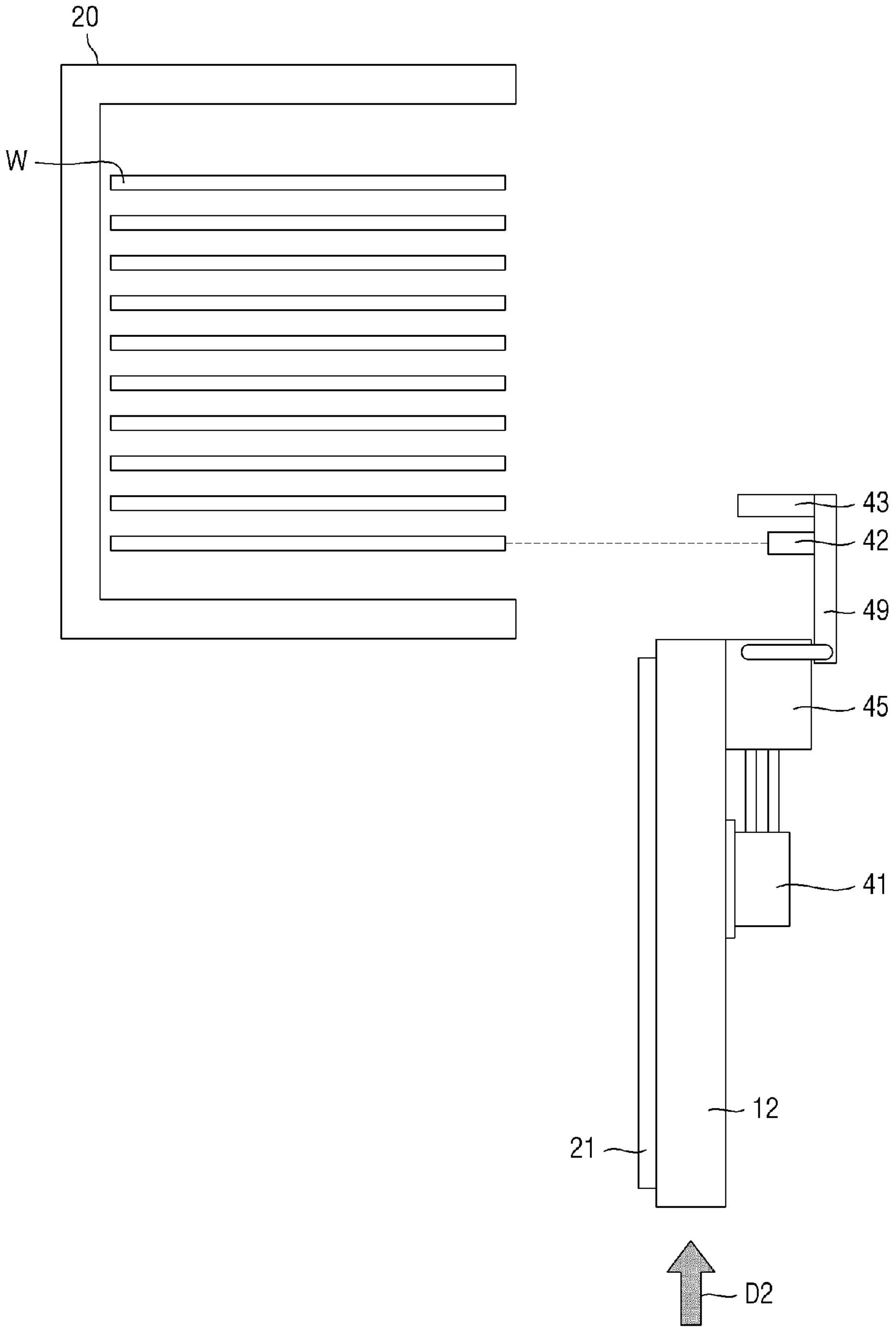
FIG. 13 is an intermediate step view for describing step S130 of FIG. 11.
Figure 14:
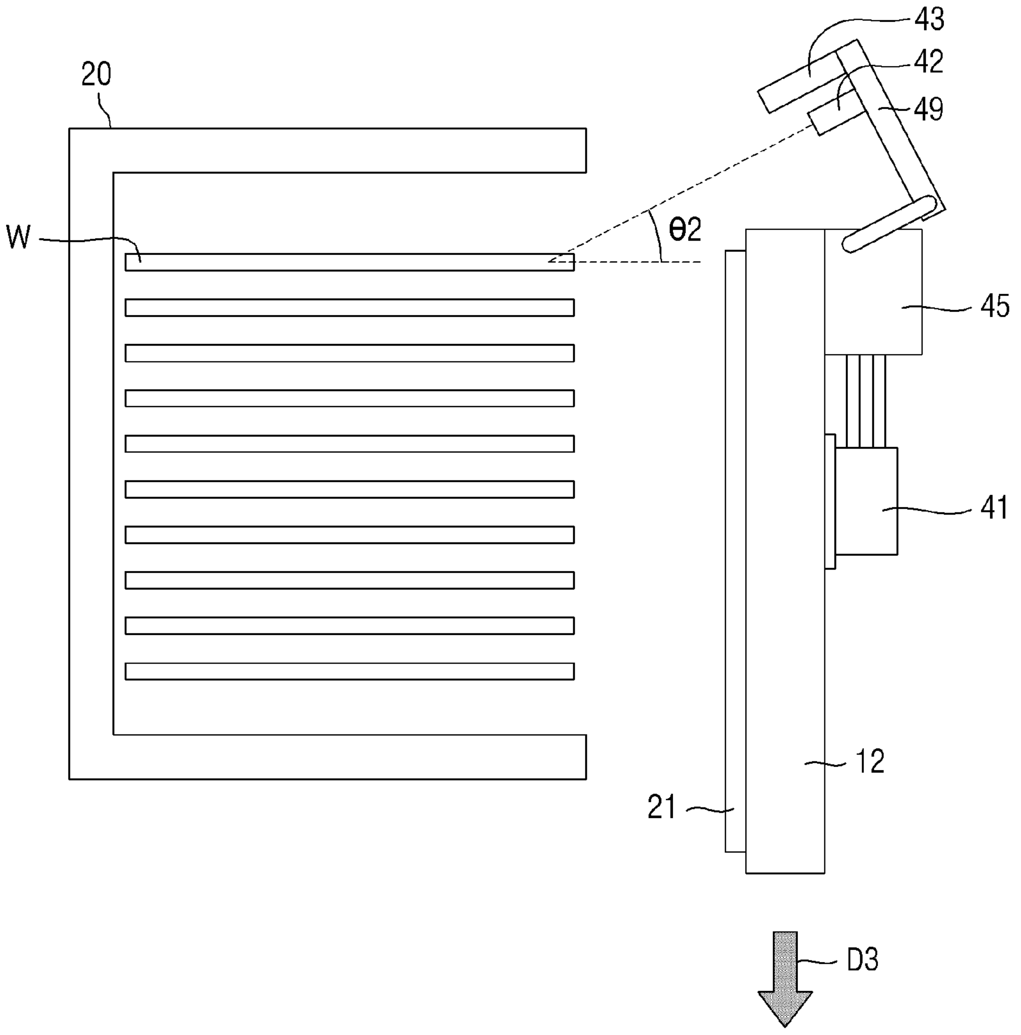
FIG. 14 is an intermediate step view for describing step S140 of FIG. 11.
Figure 15:
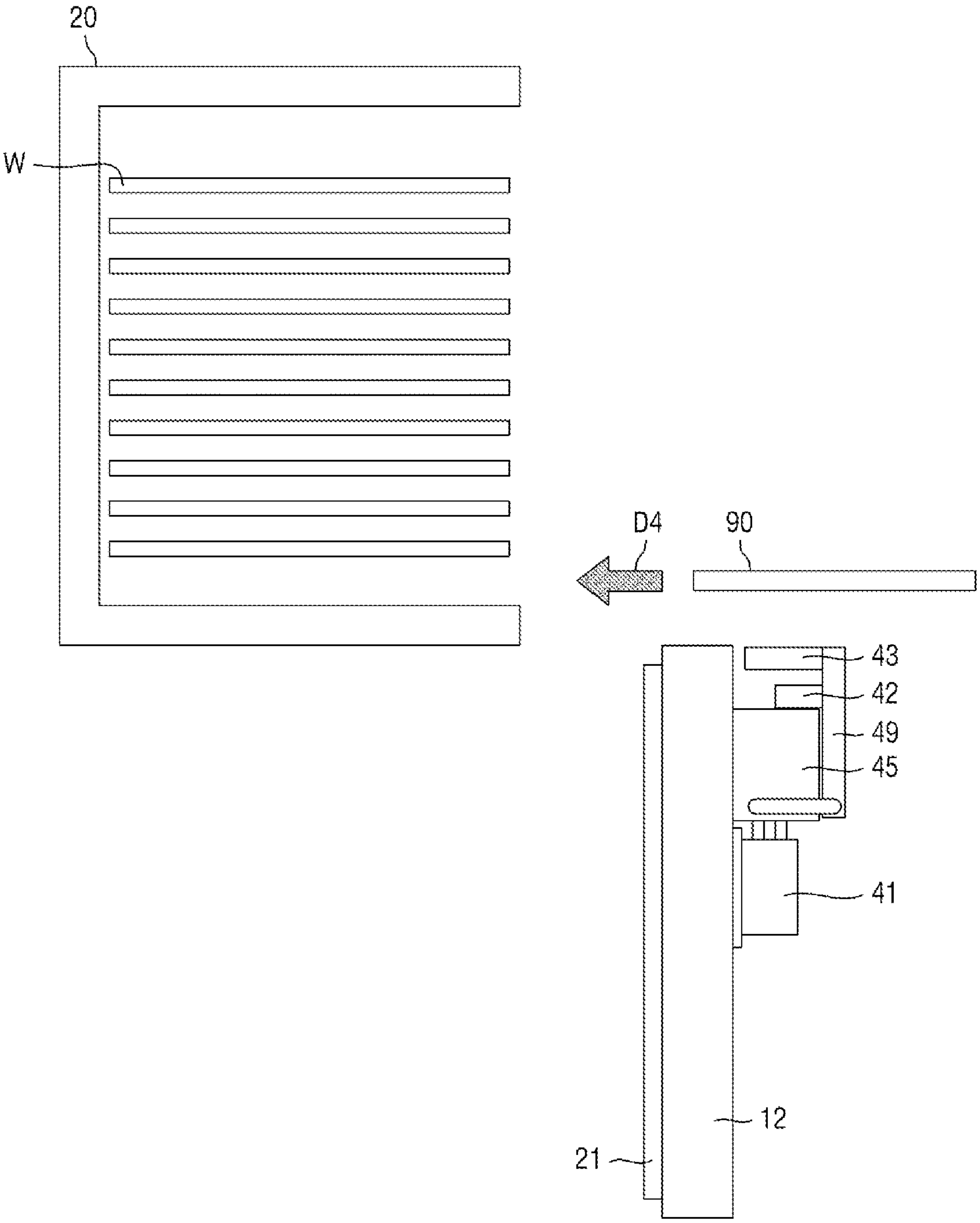
FIG. 15 is an intermediate step view for describing a method of controlling an image generator for a robot hand to enter a container.

FIG. 11 is a flow chart for describing a driving method of a load port module according to some exemplary embodiments of the present disclosure. FIG. 12 is an intermediate step view for describing step S120 of FIG. 11. FIG. 13 is an intermediate step view for describing step S130 of FIG. 11. FIG. 14 is an intermediate step view for describing step S140 of FIG. 11. FIG. 15 is an intermediate step view for describing a method of controlling an image generator to enter a robot hand into a container.

Referring to FIG. 11, the door opener 12 opens the door 21 of the container 20 (S110). The door 21 contacts the other surface of the door opener 12, and the door 21 moves along with movement of the door opener 12.

Referring to FIGS. 11 and 12, as the door opener 12 descends, the image generator 40 generates a first image by imaging the plurality of substrates W in the container 20 at a first angle θ1 (S120).

Specifically, the door opener 12 is moved so that the camera unit 42 is positioned in front of the substrate W on at the uppermost portion of the container 20. That is, the camera unit 42 is positioned at a position capable of imaging the front of the substrate W at the first angle θ1. The first angle θ1 may be an angle based on an extension direction (e.g., the second direction Y) of the plate implementing the slot SL, and may be 0° based on the extension direction of the plate as illustrated.

The door opener 12 descends (see reference numeral D1). As the door opener 12 descends, the image generator 40 generates a first image by imaging all substrates W and/or slots SL in the container 20.

The door opener 12 descends so that the camera unit 42 is positioned in front of the substrate W at the lowermost portion of the container 20.

Referring to FIGS. 11 and 13, the door opener 12 ascends again (S130).

Specifically, the door opener 12 ascends and descends again (see reference numeral D2) after imaging the front of the substrate W at the lowermost portion of the container 20. The door opener 12 moves so that the camera unit 42 is positioned so as to obliquely look or facing downwards towards the substrate W/slot SL on the uppermost portion of the container 20. To this end, the door opener 12 may be elevated to be higher than a height of the door opener 12 in FIG. 12.

Referring to FIGS. 11 and 14, as the door opener 12 descends, the image generator 40 generates a second image by imaging the plurality of substrates W in the container 20 at a second angle θ2 different from the first angle θ1 (S140).

Specifically, while the door opener 12 descends (see reference numeral D3), the camera unit 42 images all the substrates W and/or slots SL at the second angle θ2. The second angle θ2 may be an angle based on the extension direction (e.g., the second direction Y) of the plate implementing the slot SL, and may be an acute angle based on the extension direction of the plate as illustrated.

The door opener 12 descends, and images up to the substrate W and/or the slot SL at the lowermost portion of the container 20.

Referring to FIG. 11, the controller 50 determines warpage of the substrate W based on the first image and determines alignment of the substrate W based on the second image (S150).

The determination of the warpage of each of the plurality of substrates W is described with the description with reference to FIGS. 4 to 6. The determination of the alignment of each of the plurality of substrates W is described with the description with reference to FIGS. 7 to 10.

Subsequently, referring to FIG. 15, the image generator 40 is moved so that the robot hand 90 may enter the container 20.

Specifically, the body 45 descends along one surface of the door opener 12 by the cylinder 41 to prevent the head 49 and camera unit 42 from not protruding beyond an uppermost surface of the door opener 12. The robot hand 90 may enter the container 20 from an upper side of the door opener 12 to hold and move the substrate W (see reference numeral D4).

Figure 16:
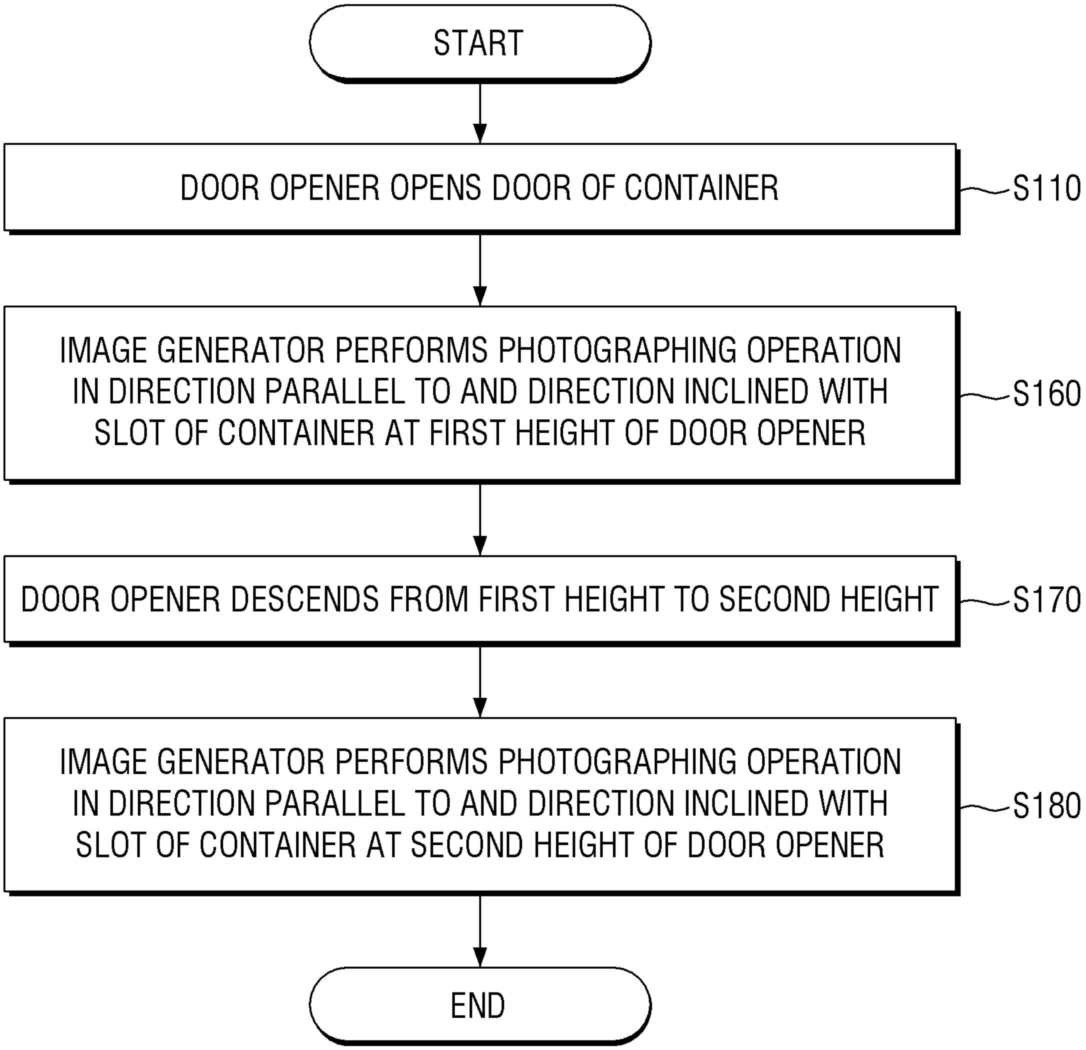
FIG. 16 is a view for describing a control method of a load port module according to some exemplary embodiments of the present disclosure.

FIG. 16 is a view for describing a control method of a load port module according to some exemplary embodiments of the present disclosure. For convenience of explanation, points different from those described with reference to FIGS. 11 to 15 will be mainly described.

In FIGS. 11 to 15, as the door opener 12 firstly descends, the image generator 40 images the substrate W at the first angle, and as the door opener 12 ascends again and descends secondly, the image generator 40 images the substrate W at the second angle different from the first angle.

On the other hand, referring to FIG. 16, image generator 40 on the door opener 12 images the substrate W at the first angle θ1 and the second angle θ2 while the door opener 12 repeatedly descends. The door opener 12 may slow or stop its movement when imaging the substrate W.

Specifically, the door opener 12 opens the door 21 of the container 20 (S110).

Subsequently, at the first height of the door opener 12, the image generator 40 performs a photographing or imaging operation at the first angle θ1 and the second angle θ2 (S160).

As described above, the first angle θ1 may be a direction parallel to the slot SL of the container 20, and the second angle θ2 may be a direction obliquely looking or facing downwards towards the slot SL of the container 20. When the image generator 40 performs the imaging operation at the first height of the door opener 12, the image generator 40 may image the substrate W on a relatively upper side at the first angle and image the substrate W on a relatively lower side at the second angle.

Subsequently, the door opener 12 descends from the first height to a second height (S170).

Subsequently, at the second height of the door opener, the image generator 40 performs the imaging operation at the first angle θ1 and the second angle θ2 (S180). When the image generator 40 performs the imaging operation at the second height of the door opener 12, the image generator 40 may image the substrate W at a relatively upper side at the first angle and image the substrate W at a relatively lower side at the second angle.

In this way, the image generator 40 performs an imaging operation with respect to all substrates W and/or slots SL in the container 20 at the first angle θ1 and the second angle θ2.

Figure 17:
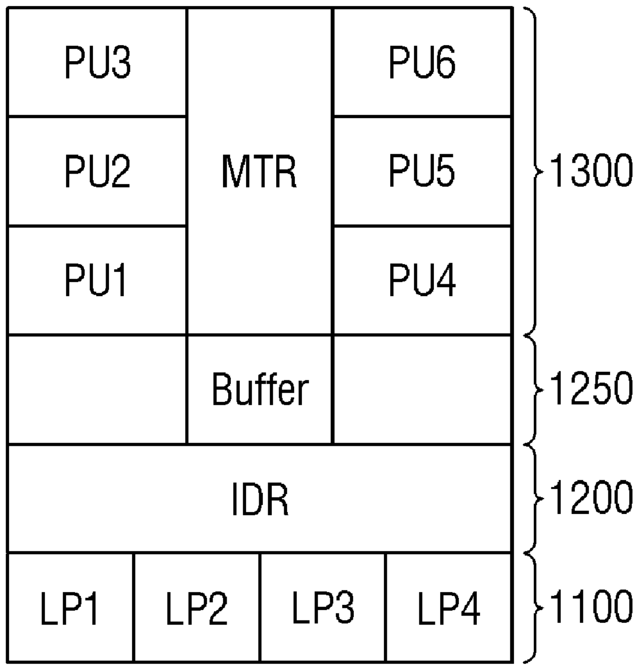
FIG. 17 is a conceptual view for describing a substrate processing apparatus according to some exemplary embodiments of the present disclosure.

FIG. 17 is a conceptual view for describing a substrate processing apparatus according to some exemplary embodiments of the present disclosure.

Referring to FIG. 17, a substrate processing apparatus according to some exemplary embodiments of the present disclosure includes an input/output module 1100, an index module 1200, a buffer module 1250, and a process module 1300.

The input/output module 1100 includes load port modules LP1 to LP4 in which a container configured to receive a plurality of substrates is placed. The illustrated load port modules LP1 to LP4 may be the load port modules described with reference to FIGS. 1 to 16. It was illustrated in the drawing that four load port modules LP1 to LP4 are provided as an example. The container may be, for example, FOUP or FOSB, but is not limited thereto.

The index module (IDR) 1200 is between the input/output module 1100 and the buffer module (Buffer) 1250. For example, the index module 1200 includes a rail in an index chamber and an index robot moving along the rail. The index robot, including an arm and a hand, picks up a substrate positioned in the input/output module 1100 and transfers the substrate to the buffer module 1250.

The buffer module 1250 temporarily stores the substrate transferred by the index robot of the index module 1200. In addition, the buffer module 1250 may temporarily store a substrate on which a preset process has been completed in at least one of process chambers PU1 to PU6.

The process module 1300 includes a transport chamber MTR and a plurality of process chambers PU1 to PU6.

The transport chamber MTR is positioned so that it extends along one direction. A guide rail and a transport robot moving along the guide rail are inside the transport chamber MTR.

The process chambers PU1 to PU6 are on both sides of the transport chamber MTR as a center. Some process chambers PU1 to PU3 may be on the left side of the transport chamber MTR, and some process chambers PU4 to PU6 may be on the right side thereof, but are not limited thereto.

For example, the process chamber PU1 may be a liquid processing chamber configured to supply a processing liquid to the substrate. The process chamber PU4 may be a drying chamber configured to remove the processing liquid remaining on the substrate processed in the liquid processing chamber, but is not limited thereto. Specifically, in the process chamber PU1, developing processing may be performed by supplying a developing solution to the substrate. The developing solution is a developing solution for a negative photoresist film, and may be, for example, n-butyl acetate (nBA). In the process chamber PU4, the remaining developing solution may be removed using carbon dioxide in a supercritical state. As another example, in the process chamber PU1, rinse processing may be performed by supplying a rinse liquid (e.g., isopropyl alcohol (IPA)) to the substrate. In the process chamber PU4, the remaining rinse liquid may be removed using carbon dioxide in a supercritical state.

Although the exemplary embodiments of the present disclosure have been described with reference to the accompanying drawings, those of ordinary skill in the art to which the present disclosure pertains will understand that the present disclosure may be embodied in other specific forms without changing the technical spirit or essential features thereof. Therefore, it should be understood that the exemplary embodiments described above are illustrative in all aspects and not restrictive.

What is claimed is:

1. A load port module comprising:

a mounting table configured to receive a container, wherein the container is configured to hold a substrate;

a door opener configured to open and close a door of the container;

an image generator on the door opener, wherein the image generator is configured to generate a first image of the substrate at a first angle with respect to an extension direction relative to a slot of the container, and a second image of the substrate at a second angle with respect to the extension direction that is different from the first angle; and a controller configured to determine a warpage of the substrate based on the first image and an alignment of the substrate based on the second image, wherein:

the substrate is one of a plurality of substrates in the container, the image generator is configured to image each one of the plurality of substrates in the container at the first angle with respect to each one of the plurality of substrates when the door opener descends during a first descent, the door opener is configured to ascend, and the image generator is configured to image each one of the plurality of substrates in the container at the second angle with respect to each one of the plurality of substrates as the door opener descends during a second descent.

2. The load port module of claim 1, wherein the first angle is a direction parallel to the slot of the container and the slot is configured to receive the substrate therein, and the second angle is a direction obliquely facing down with respect to the slot of the container.

3. The load port module of claim 1, wherein the controller is configured to map a position of the substrate within the container based on the second image.

4. The load port module of claim 1, wherein the image generator images a first one of the plurality of substrates in the container at the first angle and the second angle at a first height of the door opener, the door opener descends from the first height to a second height, and the image generator images a second one of the plurality of substrates in the container at the first angle and the second angle at the second height of the door opener.

5. The load port module of claim 1, wherein the controller is configured to determine that the substrate is misaligned in at least one of an x-direction, a y-direction, and a θ-direction by determining the alignment of the substrate, and is further configured to control a robot hand to hold the misaligned substrate to compensate for misalignment of the misaligned substrate.

6. The load port module of claim 1, wherein the image generator includes:

a body, a head connected to the body and configured to adjust an angle with respect to the substrate, and a camera unit on the head.

7. The load port module of claim 6, wherein the camera unit includes:

a first camera configured to image a first edge area of the substrate, a second camera configured to image a second edge area of the substrate, and a third camera configured to image a center area between the first edge area and the second edge area.

8. The load port module of claim 7, further comprising a light unit on the head and above the first to third cameras.

9. The load port module of claim 6, wherein the door opener is configured to ascend or descend between a first position and a second position, when the door opener descends to the second position, the body is configured to descend along a surface of the door opener to prevent the head and the camera unit from protruding beyond an uppermost surface of the door opener, and a robot hand is configured to enter the container from an upper side of the door opener and is further configured to hold and move the substrate.

10. A load port module comprising:

a mounting table configured to receive a container, wherein the container is configured to hold a substrate therein;

a door opener configured to open and close a door of the container and to move between a first position and a second position;

an image generator on the door opener and configured to generate a plurality of images of the substrate; and a controller configured to determine a state of the substrate based on the plurality of images, wherein the image generator includes:

a body configured to ascend and descend along one surface of the door opener, a head connected to the body and configured to adjust an angle formed with a slot of the container, and a camera unit on the head and configured so that an angle of imaging the substrate is changed according to the angle adjustment of the head, wherein the camera unit is configured to generate a first image of the substrate in a direction parallel to the slot of the container, and the controller is configured to determine a warpage of the substrate based on the first image, wherein the camera unit is configured to generate a second image of the substrate in a direction obliquely facing down with respect to the slot of the container, and the controller is configured to determine an alignment of the substrate based on the second image and to map a position of the substrate in the container; and wherein:

the substrate is one of a plurality of substrates in the container, the image generator is configured to image each one of the plurality of substrates in the container at the first angle with respect to each one of the plurality of substrates when the door opener descends during a first descent, the door opener is configured to ascend, and the image generator is configured to image each one of the plurality of substrates in the container at the second angle with respect to each one of the plurality of substrates as the door opener descends during a second descent.

11. The load port module of claim 10, wherein the image generator is configured to image the plurality of substrates in the container in a direction parallel to the slot of the container, after the door opener opens the door of the container and as the door opener descends, and the door opener is configured ascend after the image generator images the plurality of substrates in the direction parallel to the slot of the container, and the image generator is configured to image the plurality of substrates in the container in a direction obliquely facing down with respect to the slot of the container, as the door opener descends.

12. The load port module of claim 10, wherein the slot is one of a plurality of slots in the container, each of the plurality of substrates being received by corresponding ones of the plurality of slots in the container, the image generator is configured to perform an imaging operation in a direction parallel to and a direction inclined with a first slot of the plurality of slots of the container at a first height of the door opener after the door opener opens the door of the container, the image generator is configured to perform the imaging operation in the direction parallel to and the direction inclined with a second slot of the plurality of slots of the container at a second height of the door opener after the door opener descends from the first height to the second height.

13. The load port module of claim 10, wherein the camera unit includes:

a first camera configured to image a first edge area of the substrate, a second camera configured to image a second edge area of the substrate, and a third camera configured to image a center area between the first edge area and the second edge area.

14. The load port module of claim 13, further comprising a light unit on the head and above the first to third cameras.

15. A driving method of a load port module, the load port module comprising a mounting table configured to receive a container, the container being configured to hold a plurality of substrates therein; a door opener configured to open and close a door of the container; and an image generator on the door opener, the driving method comprising:

opening, with the door opener, a door of the container;

generating, with the image generator, a first image of each of the plurality of substrates in the container at a first angle with respect to each corresponding one of the plurality of substrates, as the door opener descends;

moving the door opener to ascend upward;

generating, with the image generator, a second image of each of the plurality of substrates in the container at a second angle different from the first angle with respect to each corresponding one of the plurality of substrates, as the door opener descends; and determining, with a controller, a warpage of each of the plurality of substrates based on a corresponding first image and determining an alignment of each of the plurality of substrates based on a corresponding second image.

16. The driving method of claim 15, wherein generating a first image of each of the plurality of substrates at the first angle includes imaging each of the plurality of substrates in a direction parallel to a slot of the container, and generating a second image of each of the plurality of substrates at the second angle includes imaging the substrate in a direction obliquely or facing downwards towards the slot of the container.

17. The driving method of claim 15, further comprising mapping, with the controller, a position of the substrate within the container based on the second image.

18. The driving method of claim 15, further comprising:

determining that one of the plurality of substrates is a misaligned substrate that is misaligned in at least one of an x-direction, a y-direction, and a θ-direction by determining an alignment of the one of the plurality of substrates, and controlling a robot hand to hold the misaligned substrate to compensate for misalignment of the substrate.

19. The driving method of claim 15, wherein the image generator includes:

a body configured to ascend and descend along one surface of the door opener, a head connected to the body and configured to adjust an angle formed with respect to a slot of the container, and a camera unit on the head so that an angle of viewing the substrate is changed according to an angle adjustment of the head.

* * * * *